United States Patent [19]
Kobayashi

[11] Patent Number: 6,078,802
[45] Date of Patent: Jun. 20, 2000

[54] HIGH LINEARITY ACTIVE BALANCE MIXER

[75] Inventor: Kevin W. Kobayashi, Torrance, Calif.

[73] Assignee: TRW Inc., Redondo Beach, Calif.

[21] Appl. No.: 08/972,578

[22] Filed: Nov. 18, 1997

[51] Int. Cl.[7] ................................................. H04B 1/16
[52] U.S. Cl. .......................... 455/326; 455/333; 327/356
[58] Field of Search ................................. 455/326, 330, 455/333, 323; 327/119, 120, 355, 356

[56] References Cited

U.S. PATENT DOCUMENTS

| | | | |
|---|---|---|---|
| 4,603,435 | 7/1986 | Butler | 455/319 |
| 4,896,374 | 1/1990 | Waugh et al. | 455/326 |
| 5,060,298 | 10/1991 | Waugh et al. | 455/326 |
| 5,175,885 | 12/1992 | Lange et al. | 455/323 |
| 5,221,909 | 6/1993 | Cole | 330/253 |
| 5,438,693 | 8/1995 | Cox | 455/333 |
| 5,740,528 | 4/1998 | Drennen | 455/330 |

OTHER PUBLICATIONS

"A Novel HBT Active Transformer Balanced Schottky Diode Mixer", by K. Kobayashi, 1996 IEEE MMT–S Dig., San Diego, CA.

*Primary Examiner*—Edward F. Urban

[57] ABSTRACT

A low power mixer with improved linearity performance. The mixer includes first and second active baluns coupled to a Schottky diode ring. Each of the active baluns includes a complementary differential Schottky switch driver which enables the Schottky diode ring-quad to be switched with full tail current which provides relatively better linearity performance per dc power consumption than known Schottky diode double balanced mixers with active baluns.

10 Claims, 5 Drawing Sheets

HIGH LINEARITY ACTIVE BALANCE MIXER

BACKGROUND OF THE INVENTION

1. Field of the Invention

The present invention relates to mixers and more particularly to low power mixers with improved linearity (IP3) performance.

2. Description of the Prior Art

Mixers are used in many commercial applications including commercial wireless applications, such as cellular telephones, cordless phones, global positioning systems and PCMCIA computer interface applications. Such applications require relatively high linearity (IP3) performance, a low noise figure and good isolation performance for frequencies less than 6 GHz. Such mixers also need to operate at relatively low dc voltages for example, less than 3.6 volts dc. Mixers used in portable dc electronics are required to have low dc power consumption to maximize battery life and also need to be relatively small in size. Many known mixers fail to accomplish all of these performance objectives.

Known Gilbert cell mixers can provide positive conversion gain, and good isolation and are relatively small area and are adapted to be monolithically integrated. Unfortunately, such known Gilbert cell mixers require relatively large amounts of dc current and power to achieve a fraction of the linearity performance of known Schottky diode mixer designs. In addition, such Gilbert cell mixers typically require about 2.5–3 $V_{BE}$ supply voltage in order to provide a reasonable linearity performance.

Conventional Schottky diode active mixer designs provide for relatively high linearity, good isolation and conversion loss performance while dissipating little or no dc power. However, conventional Schottky mixers which employ passive baluns consume relatively large areas, especially at frequencies <2 GHz and are limited to about an octave of bandwidth.

Schottky diode mixers with active baluns are also known, for example as disclosed copending U.S. Pat. application, Ser. No. 08/500725, filed on Jul. 11, 1995 and "A Novel HBT Active Transformer Balanced Schottky Diode Mixer", by K. Kobayashi, 1996 IEEE MMT-S Dig., San Diego, Calif., hereby incorporated by reference. Such mixers are configured with a active balun topology to form a double balanced mixer which provides for relatively lower power supply voltage operation and higher linearity performance than known Gilbert cell mixers while maintaining a positive conversion gain, a relatively low LO drive requirement and double balanced multi-decade frequency performance. Such mixers also provide good amplitude and antiphase balance of <±1dB and <±6° up to 5 GHz. Moreover, such mixers are also adapted to be monolithically integrated as a monolithic microwave integrated circuit (MMIC).

Referring to FIG. 3, the active balun mixer disclosed in the above mentioned patent application includes a Schottky diode ring quad and two active baluns. Each balun includes a single ended 50 ohm RF/LO input which includes a resistor $R_1$, a transistor $Q_5$ and current source $I_4$. A mirror leg which includes a resistor $R_2$. transistor $Q_6$ and current source $I_5$ is used to create a differential signal which drives a differential amplifier formed from the transistors $Q_1$, $Q_2$, a pair of low resistors $R_{L1}$, $R_{L2}$, and an emitter degeneration resistor $R_e$, and current sources $I_1$ and $I_2$. The outputs of the collectors Q1 and Q2 provide the balanced antiphase complementary outputs. The emitter degeneration resistor $R_e$ is adapted to be adjusted to increase the input power handling range of the differential output amplifier as well as the conversion gain bandwidth performance. The values of the load resistors $R_{L1}$ and $RL_2$ are selected such that the product $R_L*I$>the turn on voltage of the Schottky diodes. In this manner, the balun can be driven by a large LO source which has enough voltage to switch on the Schottky diodes under large signal operation. Because the active LO and RF baluns are directly coupled to the Schottky diode ring-quad, the voltage product $R_L*I$ must be the same for both the RF and LO active baluns so that the diodes of the Schottky diode ring-quad are biased with 0 voltage bias in the absence of the RF and LO signals. This design constraint must be maintained in order to reserve the dc balance of the Schottky diodes as well as the active baluns. The IF center-tap is formed of a pair of transistors $Q_3$ and $Q_4$, configured as followers, and a current source $I_3$. The transistors $Q_3$, Q4 combined in-phase IF signals at their emitters. The active balun is self-biased through a single supply voltage, $V_{cc}$.

One inherent limitation in such a topology is that it does not efficiently utilize the full tail current of the differential amplifier which drives the Schottky diode ring-quad which limits performance as discussed below. More particularly, when half of the Schottky diode ring is switched on by either of the LO or RF active balun drivers, the maximum current through the Schottky diodes is limited to half of the tail current of the differential amplifier switch driver. In fact, in practice the actual Schottky diode current is known to be less than half of this tail current. It is known that the higher the LO drive and thus the higher the switch current through the Schottky diodes of the ring-quad, the better the linearity performance, conversion gain and noise figure performance of a mixer. Thus, the inefficient use of the tail current to drive the Schottky diode ring-quad will lead to a less than optimum mixer conversion gain, noise figure and linearity performance for the amount of dc current consumed by the balanced drivers.

SUMMARY OF THE INVENTION

It is an object of the present invention to solve various problems in the prior art.

It is yet another object of the present invention to provide a relatively low power mixer with improved linearity performance per the amount of dc current consumed by the balanced driver.

Briefly the present invention relates to a low power mixer with improved linearity performance. The mixer, in accordance with the present invention includes first and second active baluns coupled to a Schottky diode ring. Each of the active baluns includes a complementary differential Schottky switch driver which enables the Schottky diode ring-quad to be switched with full tail current which provides relatively better linearity performance per dc power consumption than known Schottky diode double balanced mixers with active baluns.

DESCRIPTION OF THE DRAWINGS

These and other objects of the present invention will be readily understood with reference to the following specification and attached drawing wherein.

DETAILED DESCRIPTION

Figure 1:
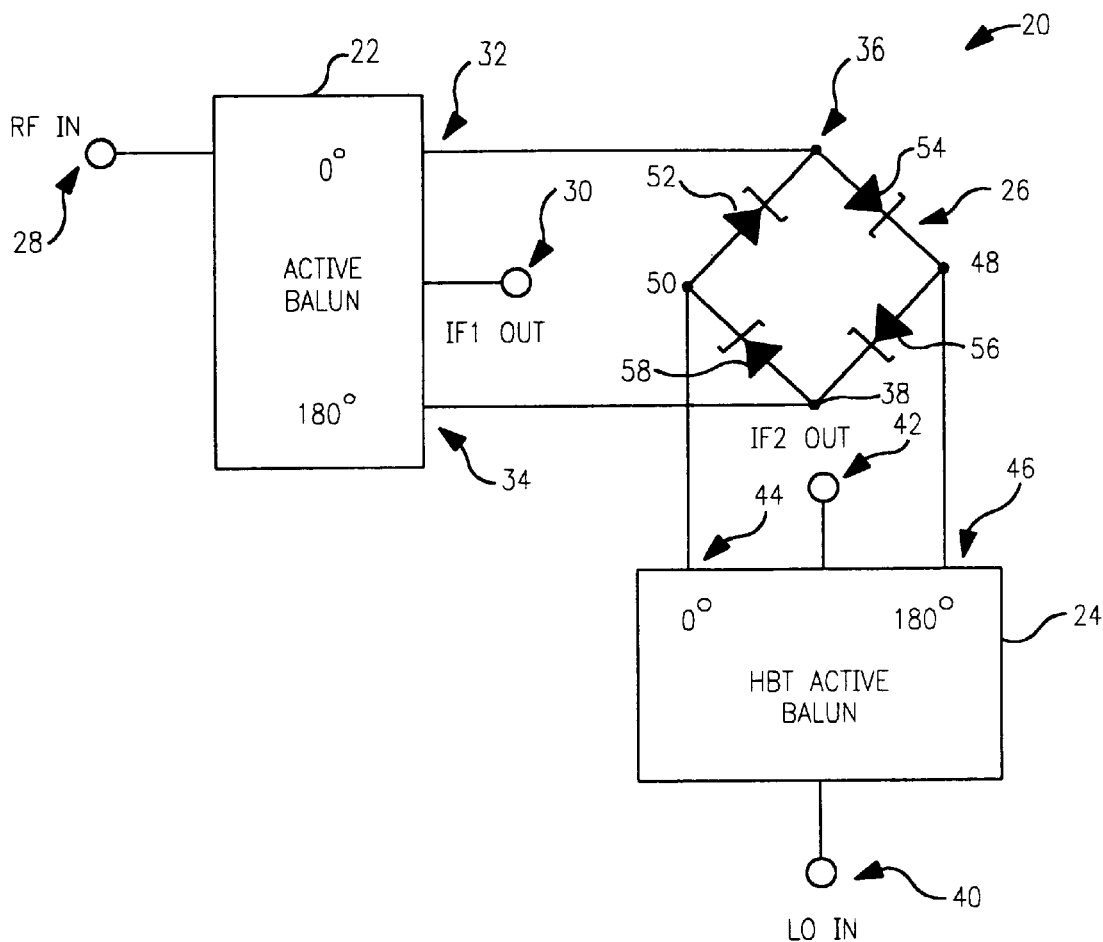
FIG. 1 is a block diagram of a double balanced Schottky ring-quad mixer with active baluns in accordance with the present invention.

As will be discussed in more detail below, the double balanced active Schottky diode mixer in accordance with the present invention, generally identified with the reference numeral 20, and illustrated in FIG. 1, provides improved linearity performance relative to other known double balanced mixers which utilize active baluns per dc power consumption. Referring to FIG. 1, the double balanced active balun Schottky diode mixer 20 includes first and second active baluns 22 and 24 and a Schottky diode ring-quad 26. The active balun 22 includes an input port 28, which may be connected to an RF input RF IN and an intermediate frequency IF output port IF1 OUT 30. The active balun 22 further includes 0° and 180° outputs 32 and 34 which are coupled to a pair of nodes 36 and 38 of the Schottky diode ring-quad 26.

The active balun 24 similarly includes an input port 40, for example, for connection to a local oscillator input LO IN and an IF output port IF2 OUT 42. The active balun 24 further includes 0° and 180° outputs 44 and 46 that are connected to a pair of nodes 48 and 50 of the Schottky diode quad ring 26.

The Schottky diode quad ring 26 includes 4 Schottky diodes 52, 54, 56 and 58. A cathode of the Schottky diode 52 is connected to the anode of the Schottky diode 54 defining the junction 36. A cathode of the Schottky diode 54 is connected to the anode of the Schottky diode 56 forming the junction 48. A cathode of the Schottky diode 56 is connected to an anode of the Schottky diode 58 defining the junction 38. Finally, a cathode of the Schottky diode 58 is connected to an anode of the Schottky diode 52 defining the junction 50. As mentioned above, the junctions 36 and 38 of the Schottky diode ring-quad 26 are coupled to the 0° and 180° output of the active balun 22 while the junctions 48 and 50 are connected to the 0° and 180° outputs 44 and 46 of the active balun 24.

Figure 2:
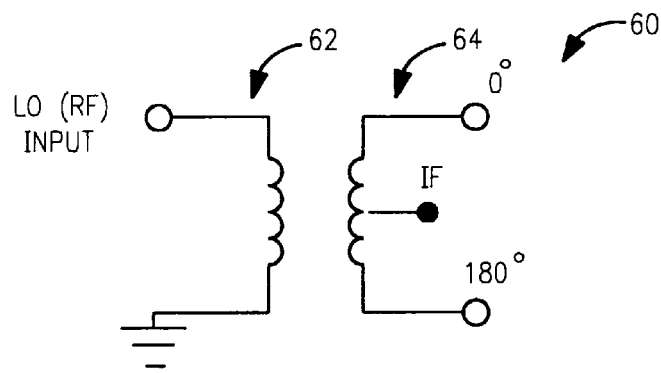
FIG. 2 is a conceptional schematic balun transformer with IF center-tap.

A conceptual schematic of a balun transformer with an IF center-tap is illustrated in FIG. 2. The balun transformer, generally identified with the reference numeral 60, is used to convert a single ended local oscillator (LO) or radio frequency (RF) input signals into two out of phase complementary signals for driving to vertices (junctions) of the Schottky diode ring quad 26. The transformer 60 is illustrated with a primary winding 62 and single secondary winding 64. A local oscillator (LO) or RF input is applied to one end of the primary winding 62 while the opposing end is grounded. The complementary 0° and 180° signals are available from the secondary winding 64. The secondary winding 64 is center-taped to provide an IF output port. As will be discussed in more detail below, the active baluns in accordance with the present invention are used to provide the same function of the balun transformer 60 but with improved gain and linearity performance.

Figure 3:
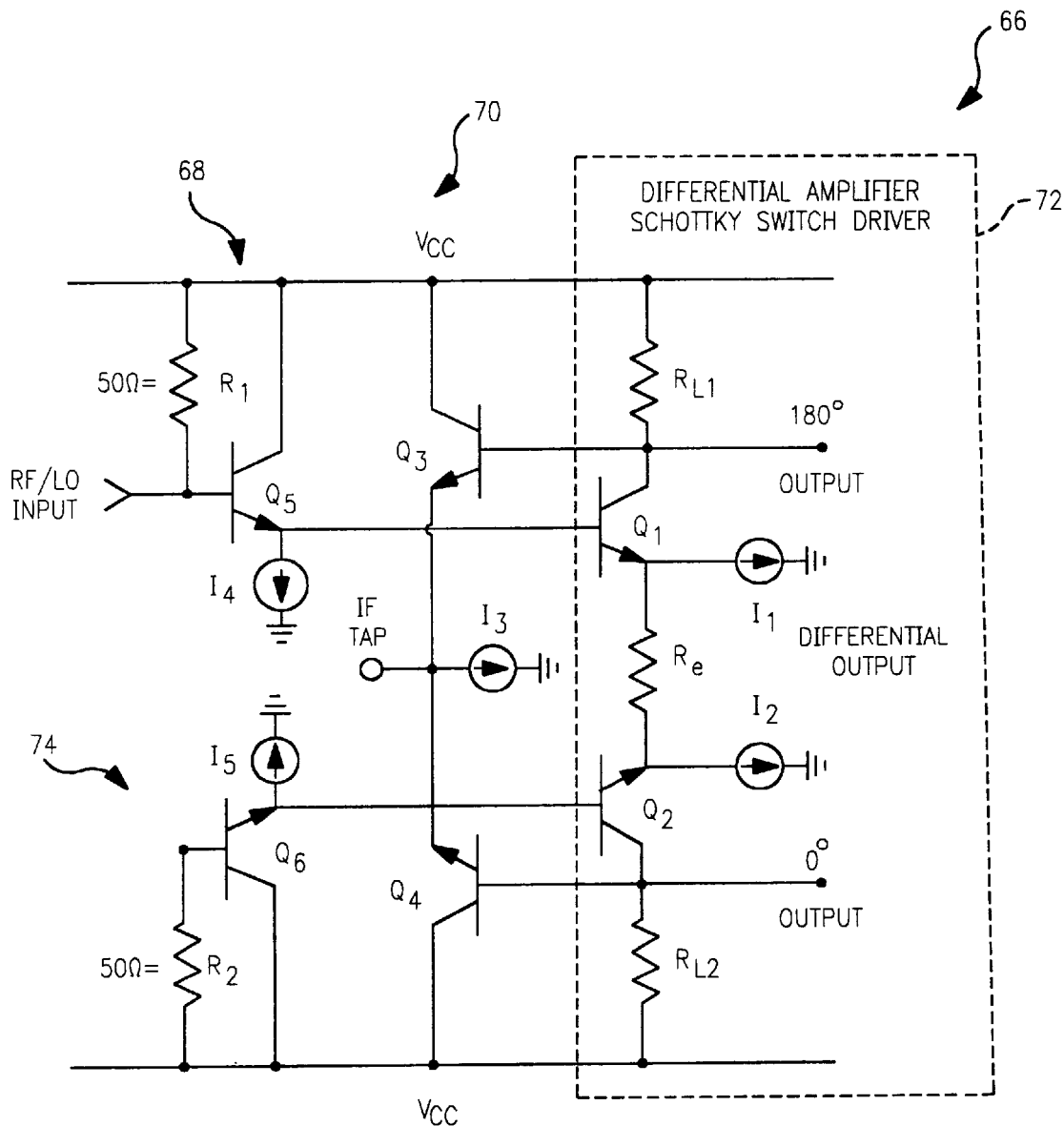
FIG. 3 is a schematic diagram of a known HBT active balun.

The present invention is best understood with reference to the known active balun 66 illustrated in FIG. 3. As illustrated in FIG. 3, the known active balun 66 includes a single ended input stage 68 which includes a transistor $Q_5$ and resistor $R_1$ configured as an emitter follower. The active balun 66 further includes an in-phase IF center-tap combiner stage 70 which includes the transistors $Q_3$ and $Q_4$ and a differential amplifier Schottky switch driver, shown within the dashed box 72. In order to provide balanced operation, a second emitter follower or mirror leg stage 74, which includes a transistor $Q_6$ and a resistor $R_2$, is applied to the differential amplifier Schottky switch driver 72.

As shown, the differential amplifier Schottky switch driver 72 includes a pair of complementary differentially connected transistors $Q_1$ and $Q_2$ a pair of load resistors $R_{L1}$, $R_{L2}$ and an emitter degeneration resistor $R_e$ connected between the emitters of the transistors $Q_1$ and $Q_2$.

As mentioned above, the active balun 66 is unable to efficiently utilize the tail current of the differential amplifier driver 72 to switch the Schottky diode ring quad which results in decreased linearity performance per dc power consumption making a mixer with such an active balun unsuitable in many applications.

Figure 4:
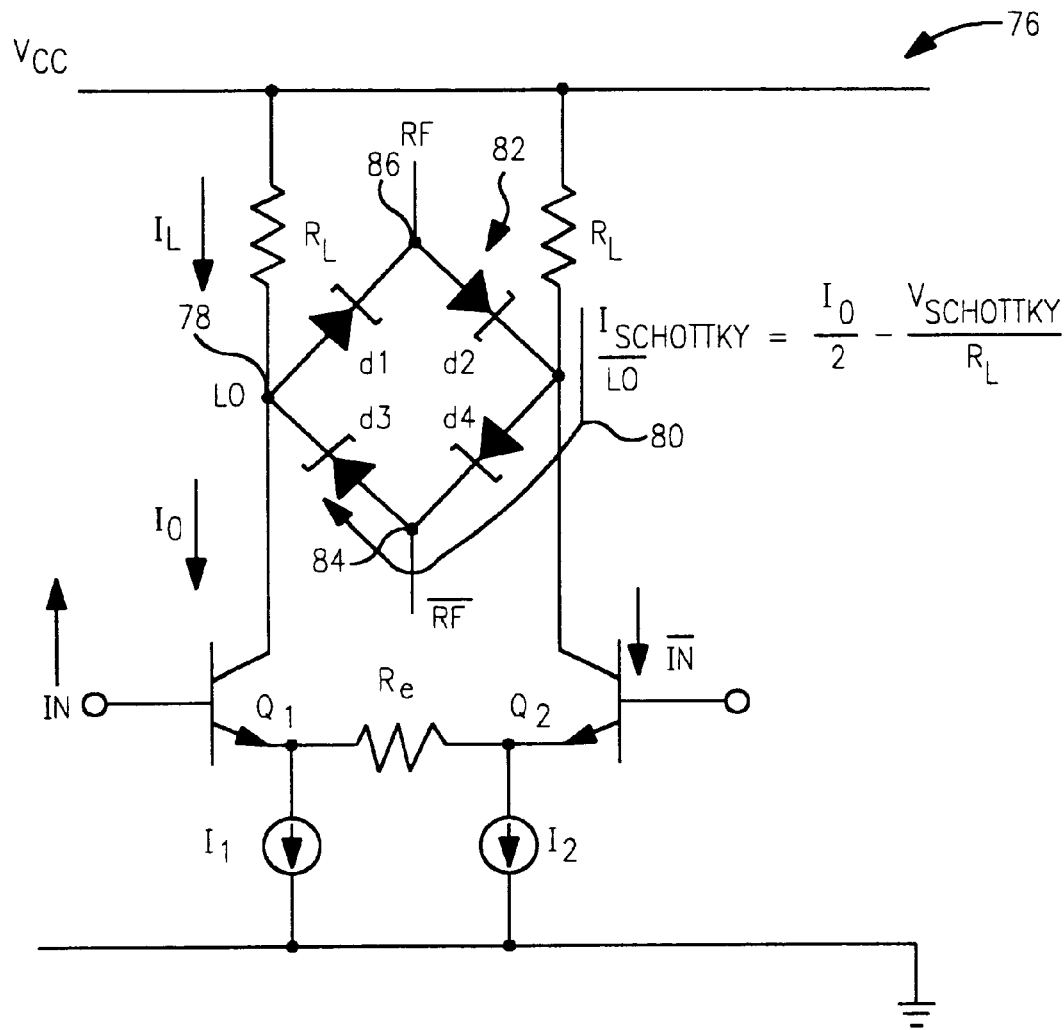
FIG. 4 is a schematic diagram of a differential amp switch driver which illustrates the operation of the active balun mixer illustrated in FIG. 3.

FIG. 4 illustrates an equivalent circuit of the differential amplifier Schottky switch driver 72 illustrated in FIG. 3 and generally identified with the reference numeral 76. As shown, complementary 0° and 180° outputs available at the collectors of the transistors $Q_1$ and $Q_2$ are shown connected to vertices or nodes 78 and 80 of a Schottky diode ring quad 82. The other two nodes 84 and 86 are driven by an identical differential amplifier Schottky switch driver not shown.

The differential amplifier Schottky switch driver 72 possesses a total tail current of $I_0=I_1+I_2$. As illustrated, when a positive voltage is applied to the base of the transistor $Q_1$ and a corresponding negative voltage to the base of the transistor $Q_2$, both of which are generated by the input stage 68, 70 of the active balun 66, a current sink which forms the total tail current $I_0$ is setup through the transistor $Q_1$. Since there is no current drawn through the transistor $Q_2$, the only current paths are the current $I_L$ through the load resistor $R_{L1}$ and the $I_{Schottky}$ through the load resistor $R_{L2}$ and the two series connected Schottky diodes $d_3$ and $d_4$. The sum of these currents $I_L$ and $I_{Schottky}$ is equal to the total tail current $I_0$ of the differential amplifier. By applying Kirshoff's current law at the LO node, the current components for the current $I_L$ and Schottky current $I_{Schottky}$ are as provided in Equations (1) and (2) below:

$$I_L = I_0/2 + V_{schottky}/R_L \quad (1)$$

$$I_{schottky} = I_0/2 - V_{schottky}/R_L \quad (2)$$

where $I_0$ is equal to the total tail current, $I_1+I_2$ ; $I_{Schottky}$ is the current through the on-switched Schottky diodes $d_3$ and $d_4$; $V_{schottky}$ is the Schottky diode's turn-on voltage, $R_L$ is the load resistor of the differential amplifier; and $I_L$ is the current through the load resistor $R_L$ of the turned on transistor forming the current sink.

Equation 2 shows that the that the maximum current which can be switched through the Schottky diodes is only half of the total driver tail current $I_0/2$. In practice, however, the $I_{Schottky}$ current will be much less than this by the amount of $V_{Schottky}/R_L$ which becomes very substantial for low dc power operation. As such, Schottky current $I_{Schottky}$ is typically less than one fourth of the total tail current. Such inefficient use of the driver tail current will result in less than optimum linearity performance, conversion gain, and NF performance per unit dc power of the mixer.

Figure 5:
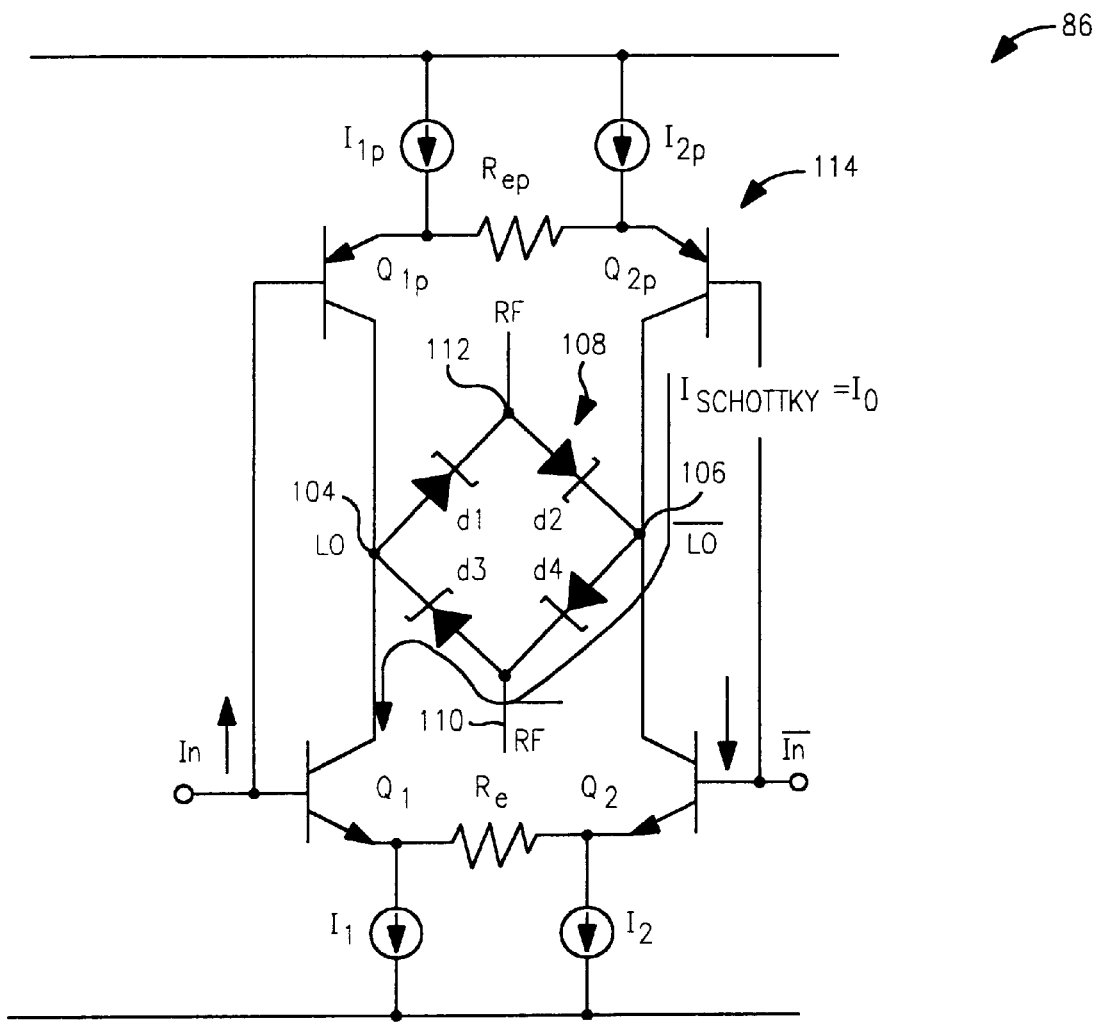
FIG. 5 is a schematic diagram of a complementary differential amplifier Schottky switch driver which forms a portion of the active balun in accordance with the present invention.
Figure 6:
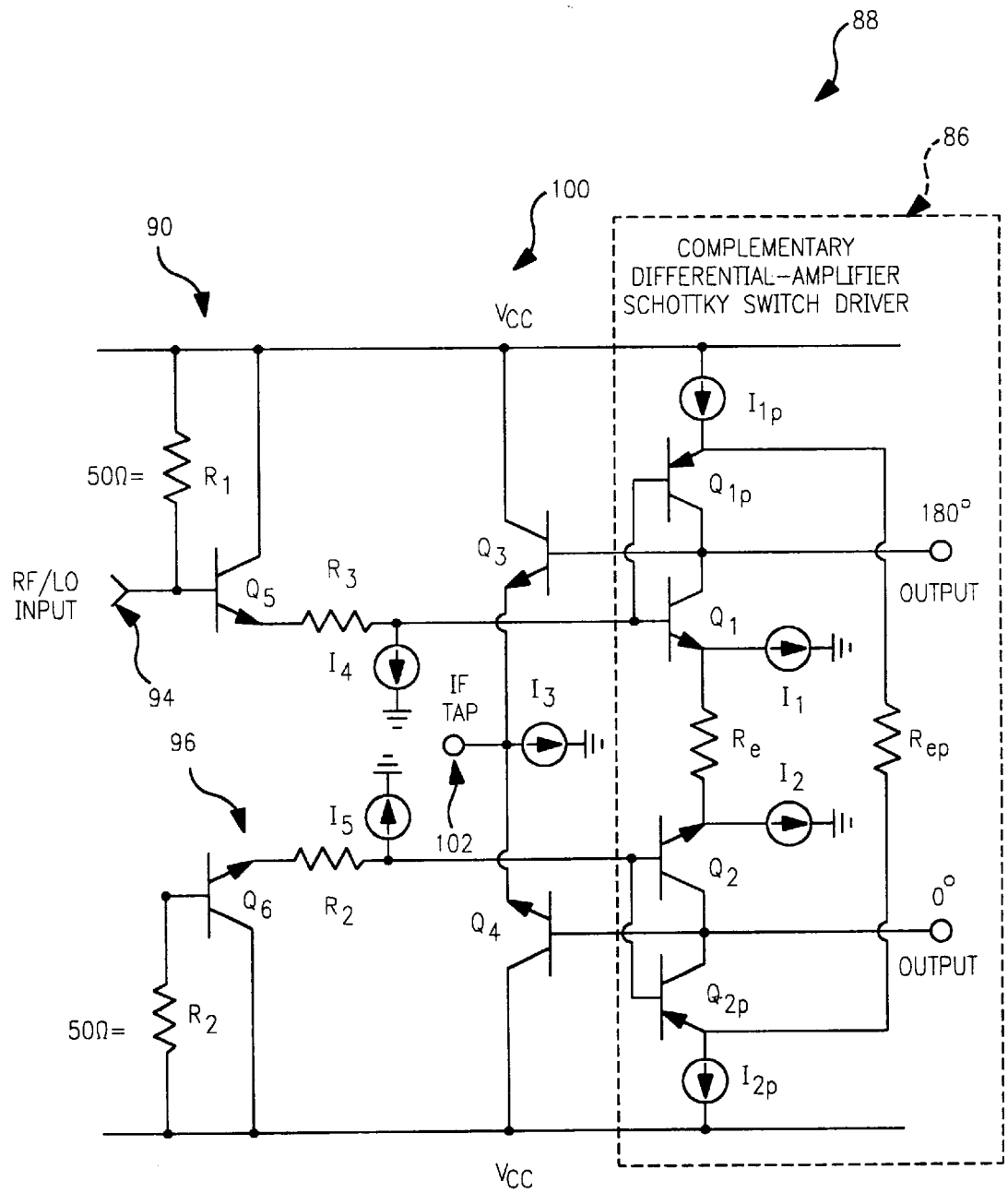
FIG. 6 illustrates an alternate embodiment of the complementary differential Schottky switch driver circuit illustrated in FIG. 5 in accordance with an alternate embodiment of the present invention.

Referring to FIG. 5, a differential amplifier Schottky switch driver, generally identified with the reference numeral 86, in accordance with the present invention improves the use of the tail current to improve the linearity performance of the mixer while providing for low power operation. The differential amplifier Schottky switch driver 86 is complementary configured and replaces the differential amplifier Schottky switch driver 72 illustrated in FIG. 3 in order to provide an active balun 88 with improved linearity performance and relatively low dc power operation. As shown in FIG. 6, the active balun 88, in accordance with the present invention, includes a single ended input stage 90 which includes a single ended input follower stage 90 which includes a resistor $R_1$, for example, 50 ohm, and a transistor $Q_5$, for example, a heterojunction bipolar transistor (HBT) and a current source $I_4$, coupled to the emitter of the transistor $Q_5$ by way of a level shifting resistor $R_3$. The base of the transistor $Q_5$ forms an input port 94 for receiving an RF/LO input. The emitter of the transistor $Q_5$ provides one input to drive the complementary differential amplifier Schottky switch driver 86 in accordance with the present invention. The other input to the complementary differential amplifier Schottky switch driver 86 is from another emitter follower stage 96 which acts as a mirror leg which includes a complementary transistor $Q_6$ and an input resistor $R_2$. The complementary input stage also includes a current source $I_5$ and a level shifting resistor $R_4$. The current source $I_5$ is used to create a differential signal which drives the complementary differential signal amplifier Schottky switch driver. The emitter output of the transistor $Q_6$ is applied to the complementary differential amplifier Schottky switch driver 86 to provide balanced operation. The transistor $Q_6$ may also be an HBT. The active balun 88 also includes an in-phase IF center-tap combiner 100. The center-tap combiner includes a pair of complementary connected transistors $Q_3$ and $Q_4$ and includes a center-tap which defines a IF output port 102.

In accordance with an important aspect of the invention, the complementary differential amplifier Schottky switch driver 86 makes efficient use of differential amplifier tail current in order to provide improved linearity performance and relatively low dc power operation. The complementary differential amplifier Schottky switch driver 86 includes a pair of differential input transistors $Q_1$ and $Q_2$ and a pair of complementary input transistors $Q_{1p}$ and $Q_{2p}$. The emitters of the transistors $Q_1$ and $Q_2$ may be connected together by way of an emitter degeneration resistor $R_e$. The collectors of the transistors $Q_{1p}$, $Q_1$ and $Q_2$, and $Q_{2p}$ are connected together and form the 0° and 180° outputs which, are adapted to be applied to the Schottky diode ring quad 26 (FIG. 1). The collectors of the transistors $Q_1$ and $Q_{1p}$ and $Q_2$ and $Q_{2p}$ provide the balanced antiphase complementary outputs, the emitter degeneration resistors $R_e$ and $R_{ep}$ can be adjusted to increase the input power handling range of the differential output amplifier as well as adjusting the conversion gain bandwidth performance. The emitters of the transistors $Q_{1p}$ and $Q_{2p}$ may also be connected together by way of a resistor $R_{ep}$. The emitter outputs of the input stage 90 and follower stage 96 are connected to the bases of the transistor $Q_1$ and $Q_2$, which, in turn, are connected to the bases of the transistors $Q_{1p}$ and $Q_{2p}$, respectively. The center-tap combiner stage 100 formed from the transistors $Q_3$ and $Q_4$ is connected to the complementary amplifier pairs $Q_{1p}$, $Q_1$, $Q_2$ and $Q_{2p}$. In particular, the base of the transistor $Q_3$ is connected to the collectors of the transistors $Q_{1p}$ and $Q_1$ and the 180° output for the switch driver 86. Similarly, the base of the transistor $Q_4$ is connected to the collectors of the transistors $Q_2$, $Q_{2p}$ to form the 0° output.

An equivalent circuit of the complementary differential amplifier Schottky switch driver 86, in accordance with the present invention, is illustrated in FIG. 5. As shown, the complementary differential amplifier Schottky switch driver 86 is connected to two vertices 104 and 106 of a Schottky diode ring quad 108. The other two vertices 110, 112 are adapted to be driven by an identical active balun not shown. As shown in FIG. 5, the complementary differential amplifier Schottky switch driver 86 utilizes a differential PNP amplifier 114, formed from the transistors $Q_{1p}$ and $Q_{2p}$, an emitter degeneration resistor $R_{ep}$ connecting the emitters of the transistors $Q_{1p}$ and $Q_{2p}$ together, and two current sources $I_{1p}$ and $I_{2p}$. The PNP differential amplifier 114 replaces the emitter resistors $R_L$ (FIG. 4) of the conventional differential amplifier Schottky switch driver 72. In the configuration illustrated in FIG. 5, the total tail current of the PNP differential amplifier 114 is equal to the sum of the current source $I_{1p}$ and $I_{2p}$ which is set equal to the total tail current $I_0$. In the configuration illustrated in FIGS. 5 and 6, the base and collector of the transistors $Q_{1p}$ and $Q_1$ are connected together. Similarly, the base and collector of the transistors $Q_{2p}$ and $Q_2$ are connected together. Such a configuration results in a unique complementary differential amplifier driver which pushes and pulls currents diagonally through the Schottky diode ring 26 (FIG. 1). More particularly, as a positive voltage is applied to the base of the transistors $Q_1$ and $Q_{1p}$ (FIG. 5), and a negative voltage is supplied to the base of the transistors $Q_2$ and $Q_{2p}$, the transistors $Q_1$ and $Q_{2p}$ turn on, while the transistors $Q_{1p}$ and $Q_2$ turn off. Current is thus pushed from $Q_{2p}$ through the diodes $d_4$ and $d_3$ and pulled through the transistor $Q_1$, while the diodes $d_1$ and $d_2$ are both reversed bias (i.e. turned off). Conversely when a negative voltage is applied to the bases of the transistors $Q_1$ and $Q_{1p}$ and a corresponding positive voltage is applied to the bases of the transistors $Q_2$ and $Q_{2p}$, the transistors $Q_2$ and $Q_{1p}$ turn on while the transistors $Q_{2p}$ and $Q_1$ turn off. In this mode of operation, current is thus pushed from the transistor $Q_{1p}$ through the diodes $d_1$ and $d_2$ and pulled through the transistor $Q_2$ while the diodes $d_3$ and $d_4$ are both reversed biased (i.e. turned off). In this manner, the Schottky diode ring quad 108 is switched with the full tail current $I_0$, more than twice that achieved from the differential amplifier switch driver 72 illustrated in FIG. 4 which ultimately results in a higher linearity, conversion gain and lower noise figure performance per unit dc power for the actively balanced Schottky diode mixer. The active balun can be self biased through a single supply voltage $V_{cc}$.

The complementary differential amplifier Schottky switch driver 86 is used to form the active baluns 22 and 24 (FIG. 1) in order to provide a mixer 20 which has higher IP3 performance per dc power current consumed due to the more efficient use of the differential amplifier driver tail current estimated to be at least 3 dB and more typically 6–10 dB. The direct coupled topology allows operation of the mixer from dc to 6 GHz; a multi-decade frequency range. There are other benefits to the double balanced mixer 20 using the active baluns in accordance with the present invention. In particular, the mixer 20 provides positive conversion gain performance which reduces the number of amplifiers required and associated dc power consumption while also providing excellent balanced isolation performance that is relatively better than a passive double balance Schottky mixer making it suitable for direct conversion receiver applications. In addition, the active mixer topology, in accordance with the present invention, is adapted to be monolithically integrated in a relatively small size (i.e. <0.65×0.3 mm$^2$) area and requires low overhead voltage to operate i.e $\leq$2.5*VBE($\leq$3.3 V) where HBT Gilbert cell mixers require $\approx$3*VBE (4.2 V) using GaAs HBTs. The active mixer, in accordance with the present invention, is adaptable to be utilized in the existing systems using HBT Gilbert cell mixers.

Obviously, many modifications and variations of the present invention are possible in light of the above teachings. Thus, it is to be understood that, within the scope of the appended claims, the invention may be practiced otherwise than as specifically described above.

What is claimed and desired to be covered by a Letters Patent is as follows:

1. An active mixer comprising:

a first active balun defining a first input port, a first output port and a first pair of balanced 0° and 180° outputs;

a second active balun defining a second input port, a second output port and a second pair of balanced 0° and 180° outputs; and a diode ring which includes four diodes electrically coupled to said first and second pairs of balanced 0° and 180° outputs;

wherein each of said first and second active baluns includes an input stage which includes an input port and a mirror leg for mirroring signals applied to said input port and a complementary differential amplifier coupled to said input port and said mirror leg, said complementary differential amplifier including a pair of differential input transistors and a pair of complementary input transistors, each of said complementary input transistors being coupled to one of said differential input transistors defining 0° and 180° outputs, each of said first and second baluns further including a center tap combiner coupled between said input port and said mirror leg and said 0° and 180° outputs.

2. The active mixer as recited in claim 1, wherein said diodes are Schottky diodes.

3. The active mixer as recited in claim 1, wherein said at least one of said differential input transistors are HBT's.

4. The active mixer as recited in claim 3, wherein at least one of said complementary input transistors are HBT's.

5. An active balun comprising:

an input stage which includes an input port and a mirror leg for mirroring signals applied to said input port;

a complementary differential amplifier electrically coupled to said input port and said mirror leg, said complementary differential amplifier including a pair of differential input transistors and a pair of complementary input transistors, each of said complementary input transistors being coupled to one of said differential input transistors and defining said 0° and 180° outputs: and a center tap combiner coupled between said input port and mirror leg and said 0° and 180° outputs.

6. The active balun as recited in claim 5, wherein said differential input and complementary input transistors each include base, emitter and collector terminals, wherein the base terminal of each of said complementary input transistors is connected to the base terminal of one of said differential input transistors.

7. The active balun as recited in claim 6, wherein said collector terminals of said complementary input transistors are connected to the collector terminals of one of said differential input transistors.

8. The active balun as recited in claim 7, wherein said center tap combiner includes a pair of transistors and a current source.

9. The active balun as recited in claim 7, wherein said differential input and complementary input transistors are HBT's.

10. The active balun as recited in claim 5, wherein said active balun is adapted to be monolithically integrated.

* * * * *